(12) United States Patent
Kalyanaraman et al.

(10) Patent No.: US 9,054,248 B2
(45) Date of Patent: Jun. 9, 2015

(54) HOLLOW PHOTOVOLTAIC FIBER

(75) Inventors: Ramakrishnan Kalyanaraman, Knoxville, TN (US); Veena Gopal Krishnan, Knoxville, TN (US); Hernando Garcia, Freehold, NJ (US); Gerd Duscher, Knoxville, TN (US); Abhinav Malasi, Knoxville, TN (US)

(73) Assignee: SunJoule Materials, Inc., Knoxville, TN (US)

( * ) Notice: Subject to any disclaimer, the term of this patent is extended or adjusted under 35 U.S.C. 154(b) by 153 days.

(21) Appl. No.: 13/465,642

(22) Filed: May 7, 2012

(65) Prior Publication Data
US 2012/0279561 A1 Nov. 8, 2012

Related U.S. Application Data

(60) Provisional application No. 61/482,882, filed on May 5, 2011.

(51) Int. Cl.
| H01L 31/0352 | (2006.01) |
| H01L 31/0224 | (2006.01) |
| H01L 31/0392 | (2006.01) |
| H01L 31/042 | (2014.01) |
| H01L 31/052 | (2014.01) |

(52) U.S. Cl.
CPC ..... *H01L 31/035281* (2013.01); *H01L 31/022433* (2013.01); *H01L 31/0392* (2013.01); *H01L 31/042* (2013.01); *H01L 31/0522* (2013.01); *Y02E 10/52* (2013.01)

(58) Field of Classification Search
CPC ..... H01L 31/00; H01L 31/02; H01L 31/0352; H01L 31/035281; H01L 31/05; H01L 31/0508
USPC .................................................. 136/243–265
See application file for complete search history.

(56) References Cited

U.S. PATENT DOCUMENTS

| 5,437,736 A | 8/1995 | Cole |
| 2007/0079867 A1 | 4/2007 | Chittibabu et al. |
| 2008/0163921 A1 | 7/2008 | Leong et al. |
| 2008/0217587 A1 | 9/2008 | Gaudiana et al. |

(Continued)

OTHER PUBLICATIONS

Gopal, Veena and Harrington, James A.; Deposition and characterization of metal sulfide dielectric coatings for hollow glass waveguides; Optics Express, Dec. 1, 2003; 1-5; vol. 11, No. 24.

(Continued)

*Primary Examiner* — Christina Chern
(74) *Attorney, Agent, or Firm* — Luedeka Neely Group, P.C.

(57) ABSTRACT

A hollow photovoltaic fiber. The hollow photovoltaic fiber includes semiconductor formed on the inner surface of a hollow tube or on a flexible substrate subsequently formed into a hollow tube. The hollow photovoltaic fiber is suitable a variety of semiconductor devices, including solar cells. Light entering the hollow photovoltaic fiber deposits energy in the semiconductor as it travel through the tube. The hollow photovoltaic fiber exhibits improved energy conversion efficiency over planar thin film solar cells due to the large semiconductor surface area and longer light travel path provided by the tube. Embodiments of the hollow photovoltaic fiber are lightweight and flexible allowing the creation of non-planar solar cells and the applications for solar cells to extend into such areas as the manufacture of photovoltaic textiles or photovoltaic non-woven fabrics.

20 Claims, 4 Drawing Sheets

(56) References Cited

U.S. PATENT DOCUMENTS

| | | | |
|---|---|---|---|
| 2008/0302418 A1* | 12/2008 | Buller et al. | 136/259 |
| 2009/0139572 A1 | 6/2009 | Gazda | |
| 2010/0095956 A1 | 4/2010 | Kim, II | |

OTHER PUBLICATIONS

Green, Martin A., Emery, Keith, Hishikawa, Yoshihiro, and Warta, Wilhelm; Solar Cell Efficiency Tables (Version 33); Progress in Photovoltaics: Research and Applications; Nov. 12, 2008; 1, 86-94.

Stuart, Howard R., and Hall, Dennis G.; Thermodynamic limit to light trapping in thin planar structures; Nov. 1997; 1, 3002-3008; vol. 14, No. 11.

Mohebbi, Mohammad, Fedosejevs, Robert; Gopal, Veena and Harrington, James A.; Silver-coated hollow-glass waveguide for applications at 800 nm; Applied Optics; Nov. 20, 2002; 1, 7032-7035; vol. 41, No. 33.

Gopal, Veena, Harrington, James A., Goren, Alon, and Gannot, Israel; Coherent hollow-core waveguide bundles for infrared imaging; Society of Photo-Opitcal Instrumentation Engineers; May 2004; 1195-1199; 43(5).

Ayse Bedeloglu, Ali Demir, Yalcin Bozkurt, Niyazi Serdar Sariciftci; A Photovoltaic Fiber Design for Smart Textiles; Textile Research Journal; 2010; 1065-1074; vol. 80(11); Sage Publishing; UK.

Yuan Li, Eric D. Peterson, Huihui Huang, Mingiun Wang, Dan Xue, Wanyi Nie, Wei Zhou, David L. Carroll; Tube-based geometries for organic photovoltaics; American Institute of Physics; June; 243505-243505-3; Applied Physics Letters 96; Published online.

Zion Tachan, Sven Ruhle, Arie Zaban; Dye-sensitized solar tubes: A new solar cell design for efficient current collection and improved cell sealing; Solar Energy Materials & Solar Cells; Nov. 1, 2009; Elsevier; Published online.

Huihui Huan, Yuan Li, Mingjun Wang, Wanyi Nie, Wei Zhou, Eric D. Peterson, Jiwen Liu, Guojia Fang, David L. Carroll; Photovoltaic-thermal solar energy collectors based on optical tubes; ScienceDirect; Feb. 5, 2011; Elsevier; Published online.

* cited by examiner

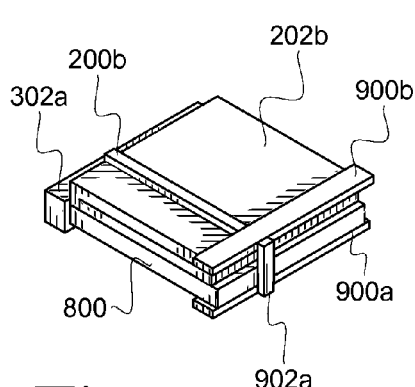
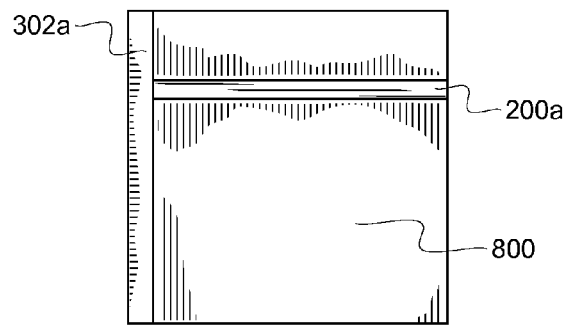
Fig. 7
Fig. 8
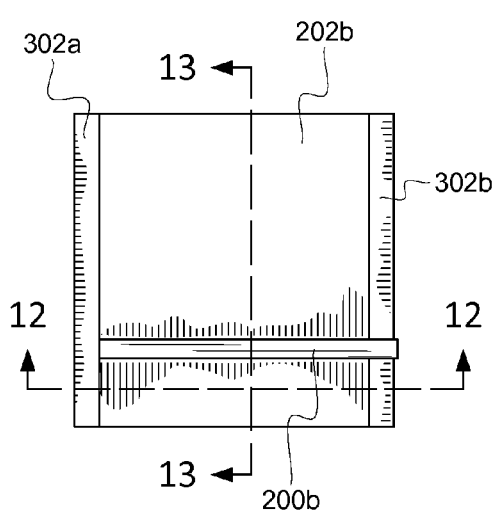
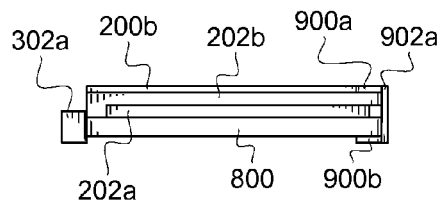
Fig. 9
Fig. 10
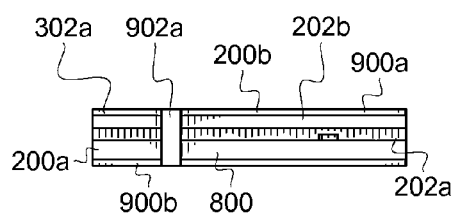
Fig. 11
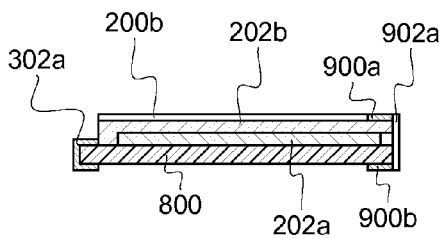
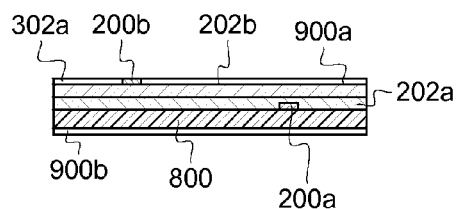
Fig. 12
Fig. 13

HOLLOW PHOTOVOLTAIC FIBER

BACKGROUND

Planar thin film solar cells (TFSC) dominate the current generation of solar cell technology. The cost and the efficiency of a planar thin film semiconductor are directly related. In other words, the techniques and materials that lead to increased efficiency also lead to increased cost. Many cost reduction techniques used with planar thin film solar cells, such as reducing the thickness of the semiconductor or eliminating materials, tend to lower efficiency, often significantly. Conventional bulk silicon (Si) solar cells have efficiencies in the range of 15% to 25%, while conventional ultrathin solar cells have efficiencies in the range of 8% to 10%. The fundamental reason for the lower efficiency of conventional ultrathin solar cells is the reduction in the amount of light trapped and absorbed resulting from the use of a thinner semiconductor.

In order for the semiconductor of a planar thin film solar cell to trap light, the light must enter the semiconductor at angles large enough to allow the light to be internally reflected. The limit to this trapping ability is often referred to as the $4n^2$ limit, where n is the refractive index for the semiconductor. Generally, the ability to trap light decreases with the thickness of the semiconductor (i.e., film) in a planar thin film solar cell. In other words, a planar thin film solar cell requires a large film thickness to maximize the amount of light that can be trapped. Conventional planar thin film solar cells commonly have complicated designs, use expensive materials, and require additional processing steps in order to approach the theoretical light trapping limit. The complexity, specialized materials, and additional processing increase the cost of planar thin film solar cells.

BRIEF SUMMARY

The hollow photovoltaic fiber includes a tubular substrate (i.e., tube), a single or multi-layer semiconductor, and two electrical contacts formed on the inner surface of the tube. Each electrical contact includes a strip contact and an edge contact. The strip contacts run the along at least a portion of the length of the hollow photovoltaic fiber. The edge contacts are disposed at opposite ends of the hollow photovoltaic fiber. Each strip contact is in electrical communication with one of the edge contacts. The tubular configuration allows the thickness of the semiconductor to be on the order of magnitude of tens of nanometers because the optical absorption depth is given by the length of the fiber rather than the thickness of the semiconductor. In various embodiments, the hollow photovoltaic fiber is hollow.

The multiple interactions between the light and the semiconductor occurring in the hollow photovoltaic fiber contribute to greater energy conversion efficiency when compared with a planar thin film solar cell. Light entering the hollow photovoltaic fiber is guided along the length of the tube and interacts with the inner surface multiple times. Each time the light interacts with the inner wall, some portion is absorbed. The remainder of the light is reflected within the tube and interacts with the inner wall at another point. Although the energy absorption during any particular interaction may be relatively small, the multiple interactions between the light and the inner wall allow the semiconductor to efficiently capture a substantial portion of the energy from the light as it travels along the tube. The multiple interactions between the light and the semiconductor effectively minimize or eliminate the impact of the strip contacts on the energy conversion efficiency of the hollow photovoltaic fiber. The multiple interactions also allow use of thinner semiconductor layers than required by planar thin film solar cells without having a significant adverse effect on the energy conversion efficiency of the hollow photovoltaic fiber.

The hollow photovoltaic fiber fabricated using a transparent substrate, absorbs light incident on the tube regardless of where the light strikes the hollow photovoltaic fiber or the angle of incidence. This allows the hollow photovoltaic fiber to operate in any orientation. With a semiconductor thickness less than or equal to 100 nm, the hollow photovoltaic fiber exhibits two-dimensional quantum mechanical effects that enhance the photovoltaic performance. The hollow photovoltaic fiber allows the production of solar cells equivalent or superior to conventional planar thin film solar cells using significantly less semiconductor and/or substrate material.

BRIEF DESCRIPTION OF THE DRAWINGS

Further features, aspects, and advantages of the invention represented by the embodiments described present disclosure will become better understood by reference to the following detailed description, appended claims, and accompanying figures, wherein elements are not to scale so as to more clearly show the details, wherein like reference numbers indicate like elements throughout the several views, and wherein:

FIG. 7 is an isometric view of one embodiment of the hollow photovoltaic fiber in a final stage of fabrication prior to forming a flexible substrate into a hollow tubular structure.

FIG. 8 is a top plan view illustrating an early intermediate stage during fabrication of one embodiment of the hollow photovoltaic fiber;

FIG. 9 is a top plan view illustrating a subsequent intermediate stage during fabrication of one embodiment of the hollow photovoltaic fiber;

FIG. 10 is a front side elevation view of one embodiment of the hollow photovoltaic fiber in the final stage of fabrication shown in FIG. 7;

FIG. 11 is a sectional side elevation view of one embodiment of the hollow photovoltaic fiber taken along line 11-11 in FIG. 10;

FIG. 12 is a right side elevation view of one embodiment of the hollow photovoltaic fiber in the final stage of fabrication shown in FIG. 7;

FIG. 13 is a sectional side elevation view of one embodiment of the hollow photovoltaic fiber taken along line 13-13 in FIG. 12;

DETAILED DESCRIPTION

A hollow photovoltaic fiber is described herein and illustrated in the accompanying figures. The hollow photovoltaic fiber includes semiconductor formed on the inner surface of a hollow tube or on a flexible substrate subsequently formed into a hollow tube. The hollow photovoltaic fiber is suitable for creating a variety of semiconductor devices, including solar cells. Light entering the hollow photovoltaic fiber deposits energy in the semiconductor as it travel through the tube. The hollow photovoltaic fiber exhibits improved energy conversion efficiency over planar thin film solar cells due to the large semiconductor surface area and longer light travel path provided by the tube. Embodiments of the hollow photovoltaic fiber are lightweight and flexible allowing the creation of non-planar solar cells and the applications for solar cells to extend into such areas as the manufacture of photovoltaic textiles or photovoltaic non-woven fabrics.

Figure 1:
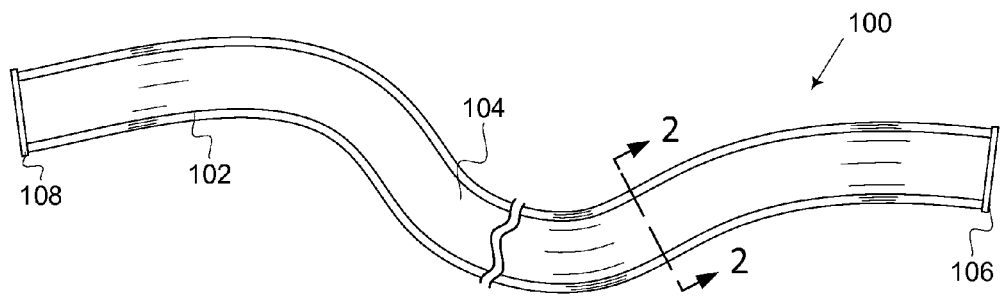
FIG. 1 illustrates a side elevation view one embodiment a hollow photovoltaic fiber.

FIG. 1 illustrates one embodiment a hollow photovoltaic fiber 100 with a semiconductor formed on the inner surface of a tubular substrate. For purposes of this application, the term semiconductor refers to a semiconductor or a photoabsorber with one or more layers. The hollow photovoltaic fiber 100 is suitable for use as a semiconductor device, including solar cells. The hollow photovoltaic fiber 100 includes a tubular substrate (i.e., tube) 102 with a semiconductor 104 formed inside the tube and two or more electrical contacts 106, 108 formed inside and around the ends of the tube. The semiconductor 104 absorbs energy from the light. The number of layers in the semiconductor is selected based on the desired type of semiconductor device or solar cells including, but not limited to, a diode, a p-n junction semiconductor or solar cell, a p-i-n junction semiconductor or solar cell, and a heterojunction semiconductor or solar cell.

The tubular configuration allows the thickness of the semiconductor to be on the order of magnitude of tens of nanometers because the optical absorption depth is given by the length of the fiber rather than the thickness of the semiconductor. The final electrical connection to an external circuit is made by attaching an electrical conductor (e.g., a wire) to each of the separate electrical contacts (e.g., at the end of the tubes).

Figure 2:
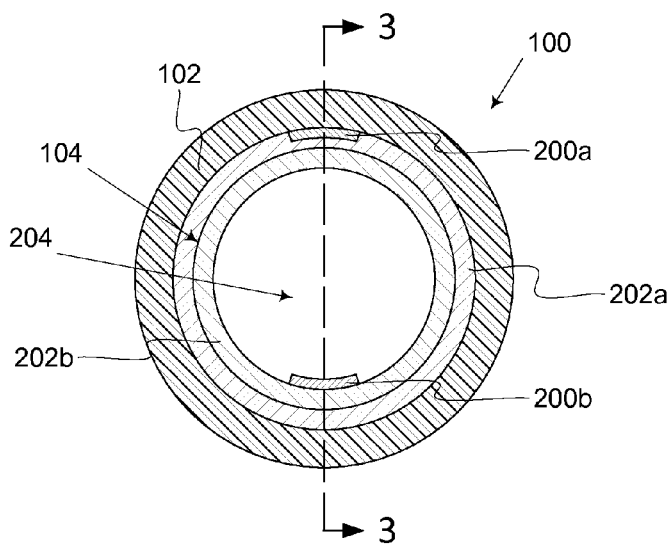
FIG. 2 is a sectional end view of the hollow photovoltaic fiber taken along line 2-2 in FIG. 1.
Figure 3:
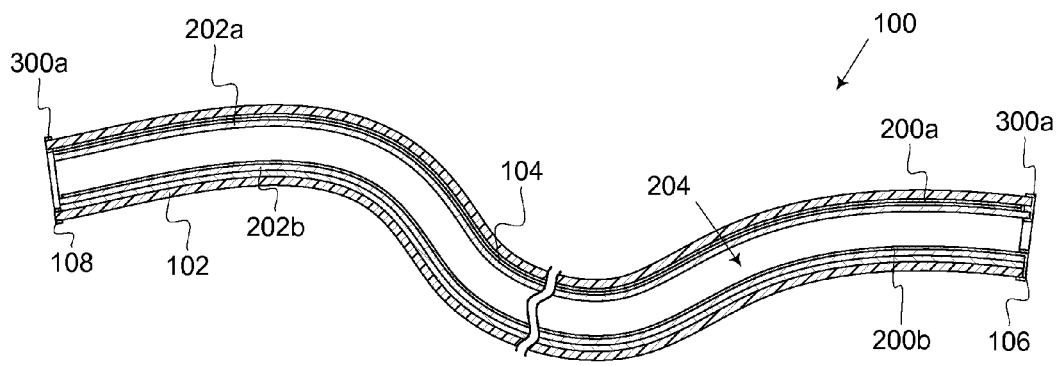
FIG. 3 is a sectional side elevation view of one embodiment of the hollow photovoltaic fiber taken along line 3-3 in FIG. 2.

FIGS. 2 and 3 are a sectional end view and a sectional side elevation view, respectively, showing additional details of one embodiment of the hollow photovoltaic fiber 100. Each electrical contact 106, 108 includes a strip contact 200a, 200b and an associated edge contact 300a, 300b. The strip contacts 200a, 200b run along at least a portion of the length of the hollow photovoltaic fiber. The edge contacts 300a, 300b are disposed at opposite ends of the hollow photovoltaic fiber. Each strip contact 200a, 200b is in electrical communication with one of the edge contacts 300a, 300b. In the illustrated embodiment, the semiconductor 104 is a multi-layer semiconductor. The outer (i.e., bottom) layer 202a of the semiconductor is electrically connected to the first electrical contact 106 and electrically isolated from the second electrical contact 108. The inner (i.e., top) layer 202b of the semiconductor is electrically connected to the second electrical contact 108 and electrically isolated from the first electrical contact 106. The remaining unoccupied area of the hollow photovoltaic fiber is the hollow central cavity 204. The hollow central cavity 204 allows the hollow photovoltaic fiber to receive and take advantage of the high light transmission efficiency of the air or other ambient transmission medium (e.g., fluid or vacuum).

The interaction between light and the semiconductor in the hollow photovoltaic fiber is fundamentally different from the interaction occurring in a typical planar thin film solar cell. First, the geometry of the hollow photovoltaic fiber allows multiple interactions between the light and the semiconductor resulting in greater energy conversion efficiency when compared to planar thin film cells. Second, the absorbing surface of the hollow photovoltaic fiber is not directionally limited. In other words, the ability of the hollow photovoltaic fiber to absorb light is not limited to a single surface or a limited range of incidence angles. These two characteristics contribute to a substantial reduction in the overall volume of the semiconductor material required by the hollow photovoltaic fiber while simultaneously improving the energy conversion efficiency of the hollow photovoltaic fiber. The hollow photovoltaic fiber efficiently traps light without special processing and additional or exotic materials (e.g., anti-reflective coatings, reflective back surfaces, plasmonic nanoparticles, surface texturing, and active cooling) commonly used to enhance light trapping efficiency in planar thin film solar cells and planar bulk solar cells. By reducing or eliminating the need for these additional materials and/or processing steps, the hollow photovoltaic fiber offers decreased complexity and a higher cost-to-performance ratio when compared to planar bulk silicon solar cells and planar thin film solar cells.

Figure 4:
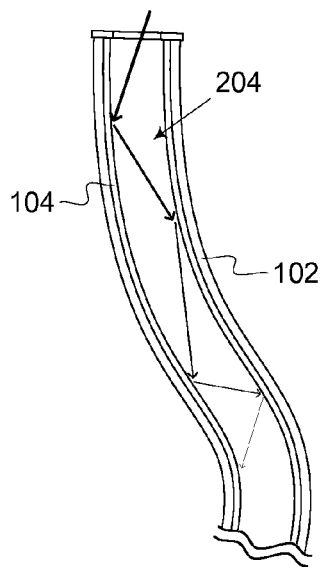
FIG. 4 is a sectional side elevation view of one embodiment of the hollow photovoltaic fiber illustrating the multiple interactions between the light and the semiconductor.

FIG. 4 is a simplified side elevation view of one embodiment of the hollow photovoltaic fiber showing the multiple interactions between light entering the end of the tube and the semiconductor 104. Light entering one end of the hollow photovoltaic fiber 100 travels through the hollow central area 204 until it strikes the inner surface of the semiconductor 104. Each time the light interacts with the semiconductor 104, some energy is absorbed. Because of the low angle of incidence, much of the light striking the inner surface of the semiconductor 104 is reflected rather than being absorbed. The reflected light continues traveling through the hollow central area 204 and reflecting off of the inner surface of the semiconductor 104. Although the energy absorption during any particular interaction between the light and the semiconductor may be relatively small, the hollow photovoltaic fiber captures a substantial portion of the energy from the light as it travels along its length because of the multiple interactions. The light trapping efficiency depends upon the length and diameter of the hollow photovoltaic fiber and the resulting number of interactions between the light and the semiconductor. In FIG. 4, the gradual light absorption is depicted by the decreasing thickness of the arrows representing the light wave with each interaction. In contrast, light striking the surface of the semiconductor in a planar thin film solar cell is partially reflected and partially transmitted, but this interaction occurs only once.

The multiple interactions between the light and the semiconductor also effectively minimize or eliminate the impact of the strip contacts on the energy conversion efficiency of the hollow photovoltaic fiber. Although excellent electrical conductors, abundant, low cost metals (e.g., aluminum and copper) reflect light. The use of low cost metals for surface contacts causes minimal reduction in the energy conversion efficiency because most of the light reflected by the surface contacts interacts with the semiconductor somewhere along its travel through the hollow photovoltaic fiber. In contrast, a planar thin film solar cell only absorbs light incident on the front surface of the semiconductor, and any light reflected from the front surface lowers the energy conversion efficiency of the solar cell. To reduce reflections from the surface contacts, planar thin film solar cells use complicated and costly architectures, such as the metal finger electrode, or contact materials that are transparent at the wavelengths of interest, such as exotic and expensive metallic compounds like indium tin oxide ($In_2O_3$ and $SnO_2$) or cheaper, low efficiency alternatives like conductive paints that offer optical transparency at the cost of higher resistive losses.

Figure 5:
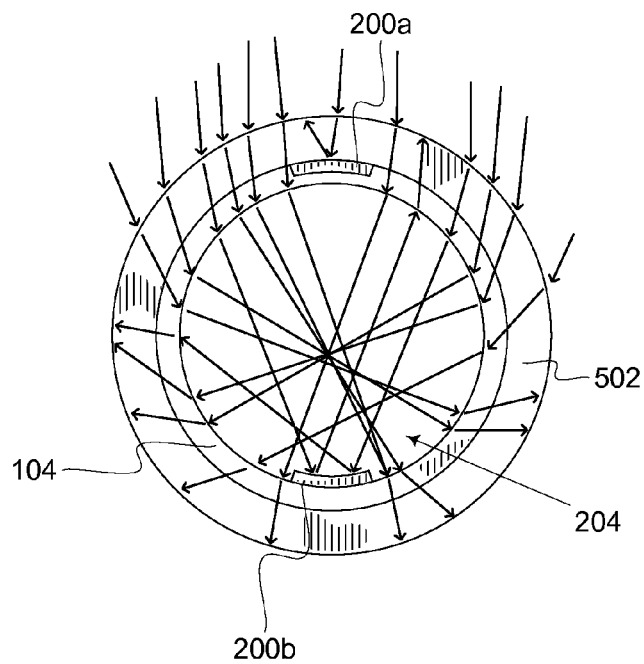
FIG. 5 is a sectional end view of one embodiment of the hollow photovoltaic fiber illustrating the multiple interactions between the light and the semiconductor.

FIG. 5 is an end view of one embodiment of the hollow photovoltaic fiber with an optically transparent tube 502 showing the interactions occurring when light strikes the side of the hollow photovoltaic fiber. In FIG. 5, the edge contact has been omitted for clarity, and the semiconductor 104 is shown as a single layer for simplicity. Using a transparent substrate allows the semiconductor to absorb light regardless of where the light strikes the hollow photovoltaic fiber or the angle of incidence. This allows the hollow photovoltaic fiber to operate in any orientation. Light striking the side of the hollow photovoltaic fiber passes through the transparent substrate 502 and impacts with the outer surface of the semiconductor 104. The semiconductor 104 absorbs some portion of the energy from the light. Light that passes through the semiconductor 104 crosses the hollow central area 204 of the hollow photovoltaic fiber and impacts the inner surface of the semiconductor 104. The semiconductor 104 absorbs some portion of the remaining energy from the light during this second interaction. Any light that travels outwardly through the semiconductor 104 passes through the transparent tube 502 and exits the hollow photovoltaic fiber 100. Thus, even when striking the hollow photovoltaic fiber from the side, light interacts multiple times with the semiconductor without the added complexity and expense of a back reflector commonly used with planar thin film solar cells.

Figure 6:
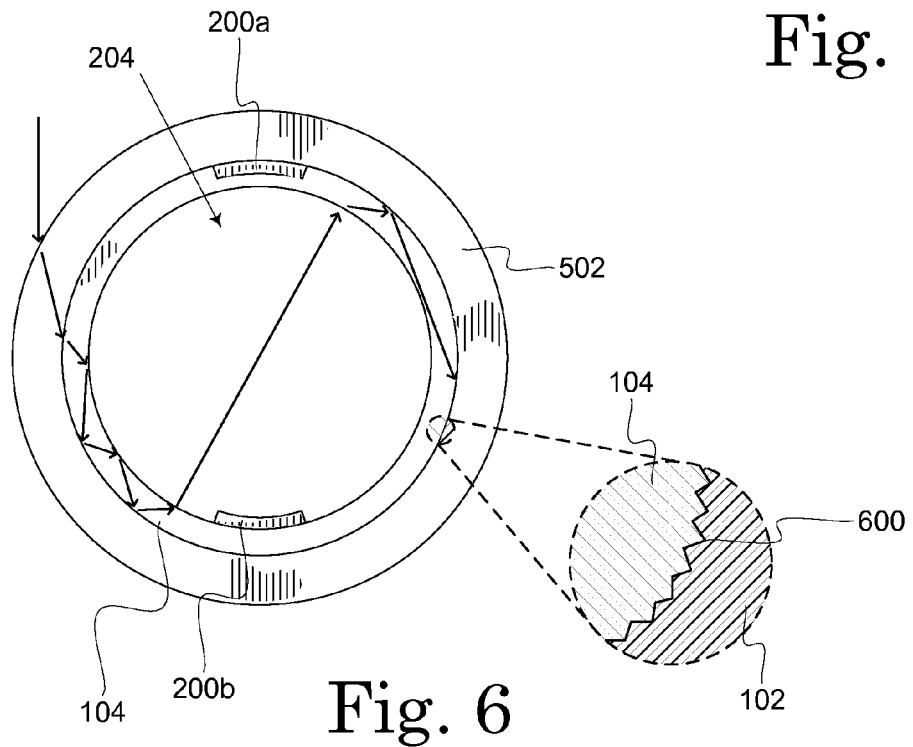
FIG. 6 is a sectional end view of one embodiment of the hollow photovoltaic fiber with surface texturing on the semiconductor illustrating the multiple interactions between the light and the semiconductor.

FIG. 6 shows the interaction occurring when light strikes the semiconductor at a high angle of incidence in alternate embodiment of the hollow photovoltaic fiber with surface texturing 600 applied to the outer surface of the semiconductor 104.

The multiple interactions between the light and the semiconductor also allow use of thinner semiconductor layers than required by planar thin film solar cells with little or no adverse effect on the energy conversion efficiency of the hollow photovoltaic fiber. In effect, the length of the hollow photovoltaic fiber is more significant to the energy conversion efficiency than the semiconductor thickness. Stated differently, efficient light absorption is achieved, even when using thin or weak absorbing semiconductors, by using a hollow photovoltaic fiber with sufficient length resulting in enough interactions between the light and the semiconductor to achieve the desired light trapping efficiency. A light trapping efficiency approaching 100% is achievable at almost any semiconductor thickness by selecting an appropriate length and diameter for the hollow photovoltaic fiber.

In various embodiments, the hollow photovoltaic fiber uses a semiconductor with a thickness less than or equal to 100 nm. With a semiconductor thickness in this low order of magnitude, the hollow photovoltaic fiber exhibits two-dimensional quantum mechanical effects, such as a quantized electron gas behavior, that enhance the photovoltaic performance. In comparison, a thin film solar cell made from silicon uses a semiconductor thickness of at least 5 μm for efficient light trapping. At this order of magnitude, two-dimensional quantum mechanical effects are not present.

The semiconductor volume of the hollow photovoltaic fiber is based on the length and, when applicable, the number of hollow photovoltaic fibers. For reference, the semiconductor volume in a conventional planar thin film solar cell is expressed as the product of the area of the solar cell and the thickness of the semiconductor. For a given number of hollow photovoltaic fibers, the length of the hollow photovoltaic fibers resulting in a solar cell with the same semiconductor volume as a planar thin film solar cell is:

$$L = \frac{A \cdot h}{n\pi[R_{OD}^2 - (R_{ID} - S)^2]}, \quad (1)$$

where L is the hollow photovoltaic fiber length, A is the area of the thin film solar cell, h is the thickness of the thin film solar cell semiconductor, n is the number of hollow photovoltaic fibers, $R_{OD}$ is the outer radius of the hollow photovoltaic fiber, and $R_{ID}$ is the inner radius of the hollow photovoltaic fiber. Assuming close packing of the hollow photovoltaic fibers, the packing efficiency is 91%. For a typical silicon thin film solar cell with a semiconductor thickness of 5 μm and a typical embodiment of the hollow photovoltaic fiber solar cell made up of approximately $1.15 \times 10^8$ hollow photovoltaic fibers with each fiber having an outside diameter of 100 μm, an inside diameter of 85 μm, and a semiconductor thickness of 0.1 μm, the hollow photovoltaic fiber length that produces a solar cell with the same semiconductor volume as the thin film solar cell is calculated using Equation 1 to be 2.6 mm. Where hollow photovoltaic fibers shorter than the equivalent length calculated using Equation 1 trap a sufficient amount of incident light, significantly less semiconductor material is required to produce solar cells equivalent or superior to planar thin film solar cells.

A similar analysis can also be done for the substrate. The volume of substrate required for a planar thin film semiconductor is expressed as the product of the area of the solar cell and the thickness of the substrate. In a planar thin film solar cell, the substrate thickness is typically 500 μm. For a given number of hollow photovoltaic fibers, the length of the hollow photovoltaic fibers resulting in a solar cell with the same substrate volume as a planar thin film solar cell is:

$$L = \frac{A \cdot t}{n\pi[R_{OD}^2 - R_{ID}^2]}, \quad (2)$$

where L is the hollow photovoltaic fiber length, A is the area of the thin film solar cell, t is the thickness of the thin film solar cell substrate, n is the number of hollow photovoltaic fibers, $R_{OD}$ is the outer radius of the hollow photovoltaic fiber, and $R_{ID}$ is the inner radius of the hollow photovoltaic fiber. As with semiconductor volume analysis, significantly less substrate material is required to produce solar cells equivalent or superior to planar thin film solar cells where hollow photovoltaic fibers shorter than the equivalent length calculated using Equation 2 trap a sufficient amount of incident light.

The dimensions of the hollow photovoltaic fiber and its components are selectable based on factors including, but not limited to, processing considerations, cost considerations, and the intended use of the hollow photovoltaic fiber. In various embodiments, the length and width of the substrate ranges from approximately a few micrometers to hundreds of centimeters. In various embodiments, the thickness and width of the edge contacts and the strip contacts range from approximately a few nanometers to hundreds of nanometers. In various embodiments, the total thickness of the semiconductor layers ranges from approximately a few nanometers to thousands of nanometers. The flexibility of the hollow photovoltaic fiber is selectable by controlling the length, inner diameter, and outer diameter of the tube based on the material chosen for the substrate (i.e., tube). A wide range for the final dimensions allows the hollow photovoltaic fibers to be used in both small and large area applications. The final dimensions of the hollow photovoltaic fiber, such as diameter and length, are determined by dimensions of the length and width of the substrate and the extent of roll up. In the various embodiments, the diameter of the hollow photovoltaic fiber ranges from approximately a few micrometers to hundreds of micrometers. In the various embodiments, the length of the hollow photovoltaic fiber ranges from approximately a few micrometers to hundreds of centimeters.

Likewise, the materials and techniques used in the fabrication of the hollow photovoltaic fiber are selectable based on factors including, but not limited to, processing considerations, cost considerations, and the intended use of the hollow photovoltaic fiber. In the various embodiments, the substrate is fabricated from an electrically non-conductive material. Suitable materials for the substrate include, but are not limited to, polymers, metals, glass, and ceramics. In the various embodiments, the electrical contacts including the edge contacts and the strip contacts are fabricated from an electrically conductive material. Suitable materials for the electrical contacts include, but are not limited to, metals, conducting polymers, conducting ceramics, and carbon based materials. It is not necessary that the various contact regions be fabricated from the same electrically conductive material. In various embodiments, the edge contacts, strip contacts, and the semiconductor layers are formed using one or more techniques including, but not limited to, physical vapor deposition (e.g., evaporation, sputtering), chemical vapor deposition, chemical bath deposition, atomic layer deposition, electroplating, electroless plating, and dip coating.

As previously noted, active cooling is not required when using solar concentrators with solar cells fabricated using hollow photovoltaic fibers. The heat generated by the concentrated light interacting with the semiconductor is distributed along the length of the hollow photovoltaic fiber, which results in small temperature rises. In addition, the strip contacts running along the length of the hollow photovoltaic fiber are thermally conductive and lead to improved heat distribution and dissipation. In contrast, planar bulk solar cells and planar thin film solar cells reach high temperatures under concentrated light because of the high surface intensity of incident light. Reducing or eliminating the need for active cooling significantly reduces cost, weight, and volume of large area solar panels fabricated using hollow photovoltaic fibers.

Various methods of fabricating the hollow photovoltaic fiber are available. FIG. 7 illustrates an isometric view of the hollow photovoltaic fiber in a final stage of fabrication prior to forming (e.g., by rolling or folding) a flexible substrate into a hollow tubular structure (or other desired geometry). One embodiment of the process leading to the final stage of the hollow photovoltaic fiber is described in reference to FIGS. 8 and 9. In various embodiments, the substrate is fabricated from a material that is sufficiently flexible at a selected thickness to allow the base structure to be rolled into a tube or bent to form structures with a selected cross-sectional geometry including, but not limited to, a semi-circle and a circle. Examples of suitable flexible materials include, but are not limited to, plastics, metals, semiconductors, and ceramics. To form a tube with closed cross-section (i.e., a cross-sectional geometry forming a closed shape), the mating or overlapping edges of the base structure are joined using any suitable mechanical, thermal, or chemical bonds including, but not limited to, adhesives, heat seal joints, solder joints, and two part fasteners (e.g., hook and loop fasteners).

FIG. 8 is a top plan view illustrating an early intermediate stage during fabrication of one embodiment of the hollow photovoltaic fiber after forming the first electrical contact on the top surface of the flexible substrate 800. The first electrical contact includes an edge contact 302a and a strip contact 200a. The edge contact 302a is a coating formed proximate to a first edge of the substrate 800. In various embodiments, the edge contact 302a encapsulates the first edge of the substrate 800. The strip contact 200a runs across the top surface of the substrate 800 between the first edge and a second edge, which is on the side of the substrate opposite from the first edge, in a direction substantially orthogonal to the first edge. The edge contact 302a and the strip contact 200a are in electrical communication. In various embodiments, the electrical connection between the edge contact and the strip contact is an ohmic connection. The length of the strip contact 200a is substantially equal to the corresponding dimension of the substrate 800. In various embodiments, the strip contact extends from the edge contact and terminates at, or proximate to, the edge of the substrate opposite from the edge contact. In various embodiments, the final length of the strip contact is controlled during formation (e.g., with the deposition mask). In other embodiments, the final length of the strip contact is adjusted using a post formation technique (e.g., etching). By way of a non-limiting example, in one fabrication method, the edge contact is fabricated using a dip coating technique. The substrate is then covered by a mask and the strip contact is deposited on the unmasked portion of the substrate using a deposition technique.

FIG. 9 is a top plan view illustrating a subsequent intermediate stage during fabrication of one embodiment of the hollow photovoltaic fiber after forming the second electrical contact. The semiconductor 104 is formed on the substrate 800. The semiconductor 104 substantially covers the strip contact 200a of the first electrical contact. The second electrical contact is formed on the semiconductor 104 and the bottom surface of the substrate 800. The second electrical contact includes an edge contact 302b and a strip contact 200b. The edge contact 302b includes a first region 900a formed on top of the semiconductor 104 proximate to the second edge of the substrate and a second region 900b formed on the bottom surface of the substrate 800 proximate to the edge of the substrate that is opposite to the first edge. The strip contact 200b runs across the top surface of the semiconductor in a direction substantially orthogonal to the second edge. The strip contact 200b includes a connecting region 902a that electrically connects the first region 900a and the second region 900b of the edge contact 302b. In various embodiments, the electrical connection between the edge contact and the strip contact is an ohmic connection.

FIGS. 10-13 are various views of the hollow photovoltaic fiber in the final stage of fabrication from FIG. 7 illustrating additional details about the construction of hollow photovoltaic fiber. As seen in FIGS. 12 and 13, the second electrical contact 108 is fabricated such it only makes electrical contact with the topmost layer of the semiconductor 202b. In other words, the second electrical contact 108 is electrically isolated from the first electrical contact 202a and, with the exception of a hollow photovoltaic fiber 100 having a single layer semiconductor, any semiconductor layer electrically connected to the first electrical contact 202a.

An alternate process for fabricating the hollow photovoltaic fiber is by forming the layers inside a hollow tubular structure. Fabrication of the hollow photovoltaic fiber inside a hollow tube involves creation of the same structures (i.e., layers) described above. The primary difference is the manner in which the layers are formed. Starting with a tube, the first edge contact is formed to encapsulate the edge of the tube at one end. The first edge contact does not enclose the end of the tube. By way of a non-limiting example, one method of forming the first edge contact is by dip coating. Next, a first strip contact in electrical communication with the first edge contact is deposited on the inside of the tube. The first strip contact runs substantial the entire length of the tube and stops at the edge or shortly before the distal end of the tube. The first strip contact is formed such that it only coats a limited fraction of the tube's inner perimeter. By way of a non-limiting example, formation of the first strip contact is accomplished using a liquid deposition process (e.g., chemical bath deposition or electroless plating) flowing the appropriate chemicals through the tube. Gravity settles the liquid in the bottom of the tube and, by limiting the volume of the liquid such that the secant defined by the top surface of the liquid corresponds to the desired portion of the tube to be coated, the width of the first strip contact is controlled. This exemplary process is scalable, cost-effective, performed near room temperature, and suitable for a wide range of conducting materials and semiconductors. The termination point of the first strip contact is controlled during formation (e.g., with the deposition mask) or adjusted using a post fabrication technique (e.g., etching). Together, the first edge contact and the first strip contact make up the first electrical contact. Once the first strip contact is formed, a semiconductor having one or more layers is formed on substantially the entire inner surface of the tube. Following the formation of the semiconductor, a second strip contact is formed. The second strip contact runs substantially the entire length of the tube, stopping at or slightly before the edge of the tube at the end where the first edge contact is located. The second strip contact overlaps the edge of the tube at the end of the tube distal to the first edge contact. The second strip contact is formed in same manner as the first strip contact. The distance separating the first strip contact and the second strip contact (i.e., the relative radial positions) is selectable by rotating the tube to the desired offset prior to forming the second strip contact. Finally, a second edge contact is formed at the end of the tube opposite from the first edge contact. The second edge contact engages the portion of the second strip contact overlapping the edge and places the second edge contact and the second strip contact in electrical communication. In various embodiments, the second edge contact coats the outer surface of the tube proximate to the end. Together, the second edge contact and the second strip contact make up the second electrical contact. The in-tube fabrication process described above for a single tube is also applicable to a group or bundle of tubes. In various embodiments, the in-tube fabrication process is applied to a substrate block having a large number of through-openings. In other embodiments, the in-tube fabrication process is applied to a porous substrate (e.g., a ceramic material) in which the pores define a large number of passageways of sufficient diameter to allow deposition liquid to pass through. For larger pores, gravity is sufficient to move the deposition liquid through. In the event that the pores are small, pumps are used to force the deposition liquid through.

Regardless of the fabrication technique used, the first electrical contact and the second electrical conductive contact are positioned to maximize the light absorbed by the semiconductor. More specifically, the distance between the strip contacts of the first electrical contact and the second electrical contact is controlled to provide a selected separation between the strip contacts. The positioning of the strip contacts is selectable to achieve the desired angular relationship between the strip contacts when the tube is formed. Similarly, the positioning of the edge contacts is selectable to maximize the absorption of incident light.

In various embodiments, the electrical connections between the semiconductor and the first or second electrical contacts are ohmic connections or Schottky connections, depending on the intended use of the hollow photovoltaic fiber. For example, a single layer semiconductor connected to one of the first electrical contact and the second electrical contact by a Schottky connection and the other by an ohmic connection results in a Schottky solar cell. When applicable (e.g., Schottky or p-n junctions), different semiconductor junction barrier strengths are achieved by selecting different conductive materials for the first electrical contact and the second electrical contact.

Large area solar cells are created by combining a number of individual hollow photovoltaic fibers in a single device. A large area hollow photovoltaic fiber solar cell is constructed by securing an array of hollow photovoltaic fibers to a base. The hollow photovoltaic fibers are packed into a selected geometry. In various embodiments, the hollow photovoltaic fibers are closely packed or randomly packed. In some embodiments, hollow photovoltaic fibers are individually secured to a base to form the array. In other embodiments, the array is created by bundling hollow photovoltaic fibers together in a selected geometry using a mechanical, chemical, or thermal bond including, but not limited to, straps, ties, shrink wraps, adhesives, and transparent polymer claddings such as poly(decyl methacrylate). In some embodiments, the resulting bundle operates as a free standing solar cell. In other embodiments, the resulting bundle is secured to the base.

Figure 14:
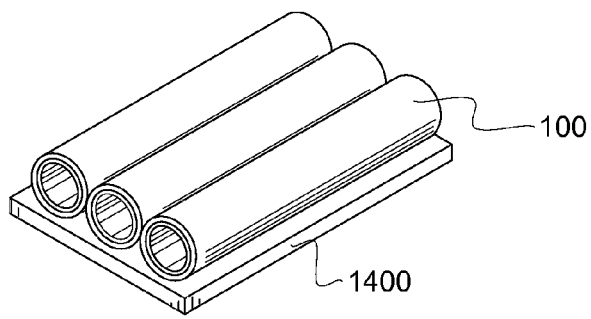
FIG. 14 illustrates one embodiment of a hollow photovoltaic fiber solar cell with the hollow photovoltaic fibers oriented parallel to the base.
Figure 15:
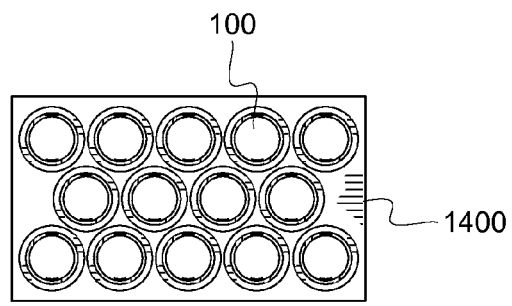
FIG. 15 illustrates one embodiment of a hollow photovoltaic fiber solar cell with the hollow photovoltaic fibers oriented perpendicular to the base.

When attached to a base, whether separately or as part of a bundle, the hollow photovoltaic fibers are placed in any desired orientation. In some embodiments, such as the one illustrated in FIG. 14, the longitudinal axis of each hollow photovoltaic fiber is oriented parallel to the plane of the base 1400. In some embodiments, such as the one illustrated in FIG. 15, the longitudinal axis of each hollow photovoltaic fiber is oriented perpendicular to the plane of the base 1400. In still further embodiments, the longitudinal axis of each hollow photovoltaic fiber is oriented such that it is neither perpendicular nor parallel to the plane of the base (i.e., at some angle in between 0° and 90°).

The hollow photovoltaic fibers are arranged such that each of the first electrical contacts and second electrical contacts of one hollow photovoltaic fiber is in electrical communication with one of first electrical contacts and second electrical contacts from another hollow photovoltaic fiber. In various embodiments, the hollow photovoltaic fibers are arranged in parallel such that each of the first electrical contacts is in electrical communication with each other first electrical contact and each of the second electrical contacts is in electrical communication with each other second electrical contact. In other embodiments, the hollow photovoltaic fibers are arranged in series such that each of the first electrical contacts is in electrical communication with the second electrical contact of another hollow photovoltaic fiber. In various embodiments, electrical communication between the hollow photovoltaic fibers is achieved by securing the hollow photovoltaic fibers such that each of the first electrical contacts is in physical contact with each other first electrical contact. In other embodiments, electrical communication between the hollow photovoltaic fibers is achieved by attaching each hollow photovoltaic fiber to the base using an electrically conductive bond including, but not limited to, a weld, a solder joint, or an electrically conductive adhesive.

Figure 16:
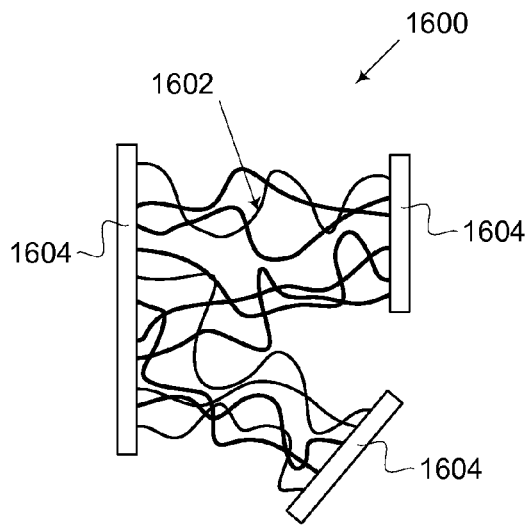
FIG. 16 illustrates one embodiment of a hollow photovoltaic fiber solar cell with the hollow photovoltaic fibers randomly ordered between two parallel plates.

In various embodiments, such as the one illustrated in FIG. 16, a flexible solar cell 1600 is formed by arranging a group of hollow photovoltaic fibers 1602 between two or more plates 1604. Each end of each hollow photovoltaic fiber 100 in the group is attached to one of the plates 1604. The plates 1604 maintain the ends of the hollow photovoltaic fibers 100 in fixed arrangement. Each plate 1604 is independently positionable relative to the other plates 1604. One non-limiting example of a method for fabricating such an arrangement is to attach each end of the group of hollow photovoltaic fibers to a plate that allows the ends of the hollow photovoltaic fibers to be optically exposed. Non-limiting examples of suitable plates include a mesh or other optically porous structure (i.e., a plate defining a plurality of through openings) and an optically transparent plate. In some embodiments, the ends of the hollow voltaic fibers are electrically connected together independently from their attachment to the plate, which allows the plate to be fabricated from an electrically non-conductive material. In other embodiments, each plate places the attached ends of the hollow photovoltaic fibers in electrical communication. By way of non-limiting examples, electrically conductive plates include plates fabricated from an electrical conductor (e.g., an aluminum plate with through openings, a metallic mesh, or an indium tin oxide plate) and electrically inert materials with integrated electrical conductors (e.g., a printed circuit board with through openings and electrically conductive traces surrounding and connecting each through opening). In various embodiments of the solar cell using electrically conductive plates, the plates are encapsulated by an electrically non-conductive cladding (e.g., rubber, a polymer, or other electrical insulator), and the cladding is etched, or otherwise removed, to optically and/or electrically expose the ends of the hollow photovoltaic fibers.

Figure 17:
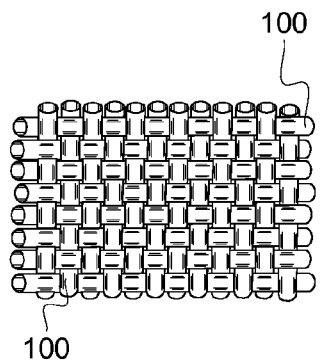
FIG. 17 illustrates one embodiment of a hollow photovoltaic fiber solar cell with the hollow photovoltaic fibers woven into a photovoltaic textile.

A hollow photovoltaic fiber has been shown in the accompanying figures and described herein. Various embodiments of the hollow photovoltaic fiber are high efficiency, low cost, light weight, flexible, omnidirectional. A solar cell constructed using embodiments of the hollow photovoltaic fiber have utility as alternatives to planar thin film solar cells and bulk silicon solar cells for large area solar cell applications. Moreover, the hollow photovoltaic fiber extends the range of applications for solar cells into non-traditional areas. Embodiments of the hollow photovoltaic fiber have utility in applications requiring a solar cell to conform to non-planar or complex shapes. Embodiments of the hollow photovoltaic fiber have utility in photovoltaic textiles, such as illustrated in FIG. 17, and/or nonwoven fabrics suitable for use in the manufacture of items such as garments, carpets, and tents.

The description and illustration of one or more embodiments provided in this application are not intended to limit or restrict the scope of the invention as claimed in any way. The embodiments, examples, and details provided in this application are considered sufficient to convey possession and enable others to make and use the best mode of claimed invention. The claimed invention should not be construed as being limited to any embodiment, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate embodiments falling within the spirit of the broader aspects of the general inventive concept embodied in this application that do not depart from the broader scope of the claimed invention.

What is claimed is:

1. A hollow photovoltaic fiber comprising:
   a tube having an inner surface, an outer surface, and a longitudinal axis;
   a first strip contact disposed on a portion of said tube inner surface, said first strip contact having a longitudinal axis running substantially parallel to said tube longitudinal axis;
   a semiconductor disposed on a substantially all of said tube inner surface and covering substantially all of said first strip contact, said semiconductor having an inner surface; and
   a second strip contact disposed on a portion of said semiconductor, said second strip contact having a longitudinal axis running substantially parallel to said tube longitudinal axis, said second strip contact electrically isolated from said first strip contact;
   wherein the semiconductor inner surface not covered by the second strip contact is in direct contact with an ambient transmission medium occupying a hollow central cavity defined by the hollow photovoltaic fiber.

2. The hollow photovoltaic fiber of claim 1 characterized in that said hollow central cavity is a central through-opening that is coaxial with said tube longitudinal axis.

3. The hollow photovoltaic fiber of claim 1 characterized in that said tube is fabricated from a material that is optically transparent.

4. The hollow photovoltaic fiber of claim 1 characterized in that said tube is flexible.

5. The hollow photovoltaic fiber of claim 1 characterized in that said semiconductor has a thickness less than or equal to 100 nm.

6. The hollow photovoltaic fiber of claim 1 characterized in that said semiconductor is sufficiently thin to exhibit quantum mechanical effects.

7. The hollow photovoltaic fiber of claim 1 characterized in that said semiconductor comprises a plurality of layers.

8. The hollow photovoltaic fiber of claim 7 characterized in that said first strip contact is in electrical communication with one of said plurality of layers and said second strip contact is in electrical communication with another one of said plurality of layers.

9. The hollow photovoltaic fiber of claim 1 characterized in that said semiconductor comprises a single layer and at least one of said first strip contact and said second strip contact is in electrical communication with said semiconductor via a Schottky connection.

10. The hollow photovoltaic fiber of claim 1 further comprising:
    a first edge contact disposed at one end of said tube, said first edge contact in electrical communication with said first strip contact and electrically isolated from said second strip contact; and
    a second edge contact disposed at the opposite end of said tube, said second edge contact in electrical communication with said second strip contact and electrically isolated from said first strip contact.

11. The hollow photovoltaic fiber of claim 10 characterized in that said first edge contact and said second edge contact cover a portion of said outer surface of said tube whereby said hollow photovoltaic fiber is electrically connectable to a second hollow photovoltaic fiber.

12. A hollow photovoltaic fiber comprising:
- a tube having an inner surface, an outer surface, and a longitudinal axis;
- a first strip contact disposed on a portion of said tube inner surface, said first strip contact having a longitudinal axis running substantially parallel to said tube longitudinal axis;
- a semiconductor disposed on a substantially all of said tube inner surface and covering substantially all of said first strip contact;
- a second strip contact disposed on only a portion of said semiconductor, said second strip contact having a longitudinal axis running substantially parallel to said tube longitudinal axis, said second strip contact electrically isolated from said first strip contact; and,
- a hollow central cavity defined by said semiconductor and said second strip contact, the hollow central cavity containing an ambient transmission medium with high light transmission efficiency.

13. The hollow photovoltaic fiber of claim 12 characterized in that said hollow central cavity is a central through-opening that is coaxial with said tube longitudinal axis.

14. The hollow photovoltaic fiber of claim 12 characterized in that said semiconductor has a thickness less than or equal to 100 nm.

15. The hollow photovoltaic fiber of claim 12 characterized in that said semiconductor is sufficiently thin to exhibit two-dimensional quantum mechanical effects.

16. The hollow photovoltaic fiber of claim 12 characterized in that each of said strip contacts has a length substantially equal to the length of said tube.

17. The hollow photovoltaic fiber of claim 12 characterized in that said tube is fabricated from an optically transparent material.

18. The hollow photovoltaic fiber of claim 12 characterized in that said tube is flexible.

19. The hollow photovoltaic fiber of claim 12 further comprising:
- a first edge contact disposed at one end of said tube, said first edge contact in electrical communication with said first strip contact and electrically isolated from said second strip contact; and
- a second edge contact disposed at the opposite end of said tube, said second edge contact in electrical communication with said second strip contact and electrically isolated from said first strip contact.

20. The hollow photovoltaic fiber of claim 19 characterized in that said first edge contact and said second edge contact cover a portion of said outer surface of said tube, wherein said first edge contact is electrically connected to the second edge contact of a second hollow voltaic fiber.

* * * * *